(12) United States Patent
Kuramae

(10) Patent No.: US 6,455,387 B2
(45) Date of Patent: Sep. 24, 2002

(54) SEMICONDUCTOR DEVICE AND METHOD OF MANUFACTURING THE SAME

(75) Inventor: Masaki Kuramae, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/734,738

(22) Filed: Dec. 13, 2000

(30) Foreign Application Priority Data

Mar. 15, 2000 (JP) .......................................... 2000-072887

(51) Int. Cl.[7] .............................................. H01L 21/336
(52) U.S. Cl. ........................ 438/301; 438/240; 438/266; 438/398; 438/665; 257/306; 257/308; 257/309; 257/398; 257/534
(58) Field of Search ................................ 438/301, 398, 438/240, 665, 266; 257/306, 534, 309, 308, 398

(56) References Cited

U.S. PATENT DOCUMENTS

| | | | |
|---|---|---|---|
| 5,858,837 A | * 1/1999 | Sakoh et al. | 438/255 |
| 5,943,570 A | 8/1999 | Park et al. | 438/8 |
| 5,959,326 A | * 9/1999 | Aiso et al. | 257/306 |
| 6,013,549 A | 1/2000 | Han et al. | 438/253 |
| 6,215,143 B1 | * 4/2001 | Han et al. | 257/309 |
| 6,218,260 B1 | * 4/2001 | Lee et al. | 438/398 |
| 2001/0001501 A1 | * 5/2001 | Lee et al. | 257/534 |

FOREIGN PATENT DOCUMENTS

| | | |
|---|---|---|
| JP | 9-186302 | 7/1997 |
| JP | 11-135759 | 5/1999 |

\* cited by examiner

*Primary Examiner*—Richard Elms
*Assistant Examiner*—Pho M. Luu
(74) *Attorney, Agent, or Firm*—Armstrong, Westerman & Hattori, LLP

(57) ABSTRACT

There are contained the steps of forming an undoped or low impurity concentration amorphous silicon film to project from an upper surface of a first insulating film, introducing selectively impurity into an uppermost surface of the amorphous silicon film to form the uppermost surface of the amorphous silicon film as a high concentration impurity region, forming hemispherical grained silicon on the uppermost surface of the amorphous silicon film at a first density and on a side surface at a second density higher than the first density by exposing the amorphous silicon film to a silicon compound gas and then annealing the amorphous silicon film in a low pressure atmosphere, and introducing the impurity into the hemispherical grained silicon and the amorphous silicon film. Accordingly, a semiconductor device having a capacitor, in which a cylindrical storage electrode from an upper surface of which silicon projections are difficult to come off is formed, can be provided.

13 Claims, 12 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Prior Art

In the semiconductor memory device, the integration density of the memory cell is increased more and more based on the request for the larger capacity. The memory cell in DRAM consists of the MOS transistor and the capacitor, and the capacitor region is reduced with the higher integration of the memory cell. Then, if the capacitor forming region is reduced, the electrostatic capacity of the capacitor is also reduced, which causes increase in the soft error rate or reduction in the refreshing capability.

Therefore, in order to increase the electrostatic capacity of the capacitor, such a configuration is adopted that either a surface area of the storage electrode constituting the capacitor is increased or material with a high dielectric constant is employed as material of the dielectric film. In order to increase the surface area of the storage electrode, it has been known that a height of the storage electrode is increased, or the storage electrode is formed as a cylindrical shape, or a HSG (Hemispherical Grained Silicon) layer is formed on a surface of the storage electrode.

The increase of the surface area by forming the HSG layer on the surface of the storage electrode is set forth in Patent Application Publication (KOKAI) Hei 11-135759 and Patent Application Publication (KOKAI) Hei 9-186302, for example.

The formation of such HSG layer on the surface of the cylindrical storage electrode has such a merit that the surface area of the storage electrode is increased much more.

However, after the HSG layer is formed on the surface of the cylindrical storage electrode, the hemispherical silicon is ready to come off from the ring like upper surface or the corner portion of the cylindrical storage electrode. Especially, coming-off of the hemispherical silicon occurs remarkably if the HSG layer is cleaned by the chemicals after such HSG layer is formed on the surface of the cylindrical silicon.

For example, as shown in FIG. 1A, a number of hemispherical projections 100 are formed on the uppermost ring-like surface of the storage electrode immediately after the HSG layer is formed on the overall surface of the cylindrical silicon storage electrode. In this case, if the storage electrode is cleaned by use of the liquid chemicals thereafter, a part of the hemispherical projections 100 on the uppermost surface are come off. Thus, as shown in FIG. 1B, coming-off pieces 101 of the hemispherical projections 100 cause the cylindrical storage electrodes 102 and 102 to short-circuit each other.

SUMMARY OF THE INVENTION

It is an object of the present invention to provide a semiconductor device having a cylindrical storage electrode in which it is difficult for a silicon projection to come off from an upper surface, and a method of manufacturing the same.

According to the present invention, before the hemispherical grained silicon is formed on the surface of the undoped or low impurity concentration cylindrical or column amorphous silicon film, the impurity is implanted into the uppermost surface of the cylindrical amorphous silicon film with high concentration, e.g., higher than $2\times10^{20}$ cm$^{-3}$.

According to such condition, the hemispherical grained silicon is extremely difficult to grow on the uppermost surface of the amorphous silicon film, and thus the density of the hemispherical grained silicon can be reduced largely lower than that of the side surfaces (the inner peripheral surface and the outer peripheral surface in the case of the cylindrical shape). The hemispherical grained silicon is formed on the surface by the movement of silicon atoms. Such movement of the silicon atoms is suppressed in the higher impurity concentration portion of the amorphous silicon film.

Such a probability that the hemispherical grained silicon comes off from the corner portion of the uppermost surface of the cylindrical amorphous silicon film can be extremely reduced. Thus, the short circuit between the adjacent silicon films due to the come-off hemispherical grained silicon is avoided.

DETAILED DESCRIPTION OF THE PREFERRED EMBODIMENTS

Embodiments of the present invention will be explained in detail with reference to the accompanying drawings.

(First Embodiment)

FIGS. 2A to 2J are sectional views showing semiconductor device manufacturing steps according to a first embodiment of the present invention.

Figure 1A:
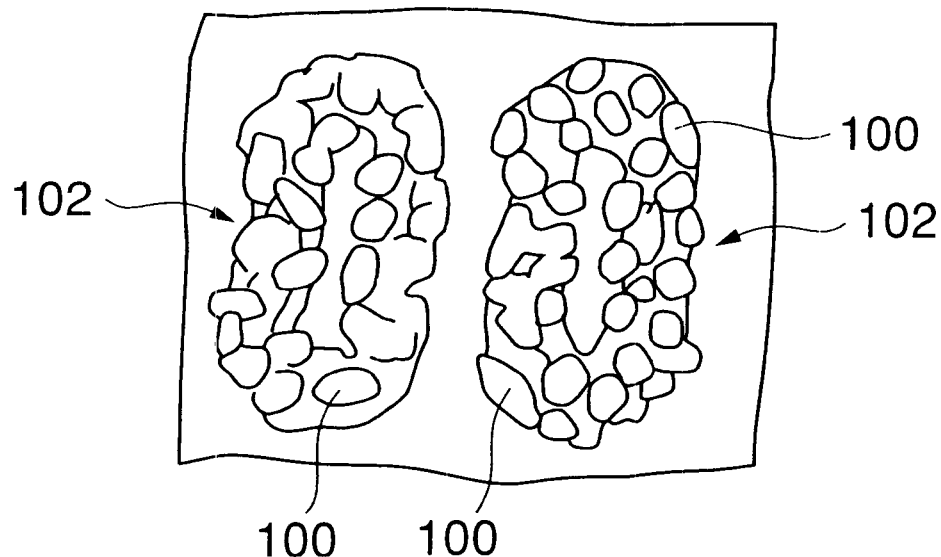
FIGS. 1A and 1B are upper views each showing a storage electrode in the prior art.
Figure 1B:
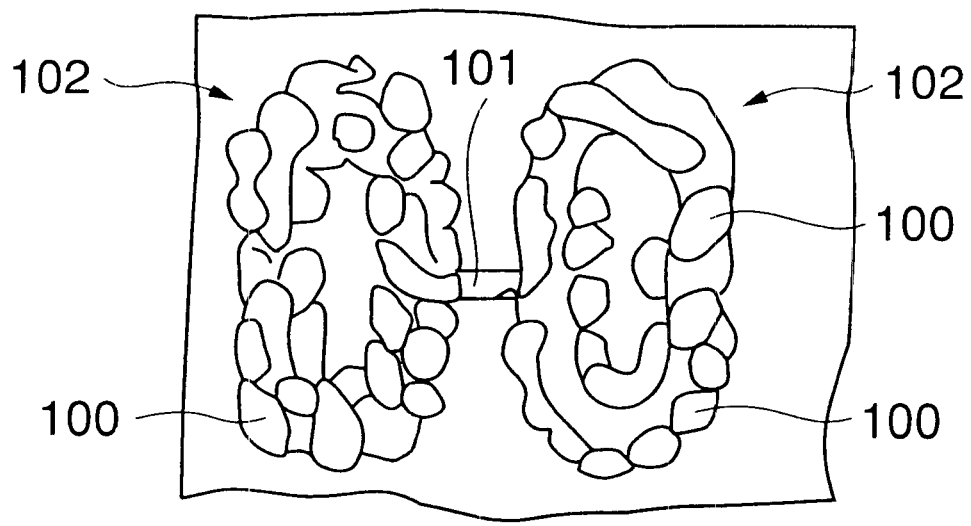
Figure 2A:
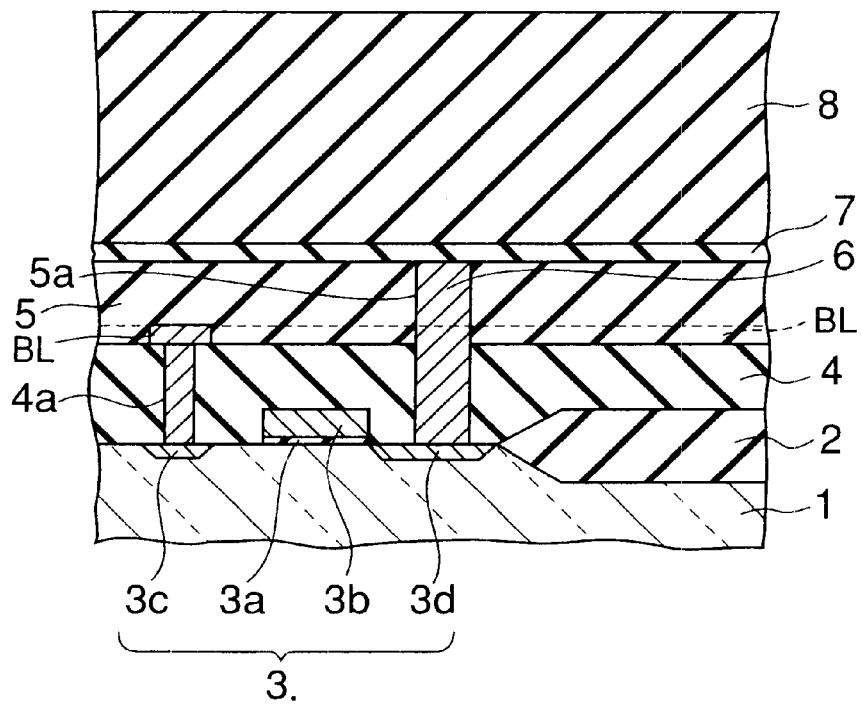
FIGS. 2A to 2J are sectional views showing the steps of forming a memory cell according to a first embodiment of the present invention.

First, as shown in FIG. 2A, a LOCOS layer 2 is formed in a device isolation region of a p-type silicon (semiconductor) substrate 1, and a MOS transistor 3 is formed in a device forming region surrounded by the LOCOS layer 2. A gate electrode 3b is formed in the device forming region on the silicon substrate 1 via a gate insulating film 3a. First and second n-type impurity diffusion layers 3c, 3d are formed on both sides of the gate electrode 3b on the silicon substrate 1. Thus, a MOS transistor 3 is composed of these elements. The gate electrode 3b is also used as the word line.

Also, a first interlayer insulating film 4 made of SiO$_2$ is formed on the silicon substrate 1 to cover the MOS transistor 3, the LOCOS layer 2, etc. The first interlayer insulating film 4 has a single layer structure or a multi-layered structure, and a first hole 4a is formed on the first n-type impurity diffusion layer 3c. Then, a bit line BL is formed on the first interlayer insulating film 4 and connected to the first n-type impurity diffusion layer 3c via the first hole 4a.

A second interlayer insulating film 5 made of $SiO_2$ is formed on the bit line BL and the first interlayer insulating film 4.

In such condition, a second hole 5a is formed on the second n-type impurity diffusion layer 3d by patterning the first interlayer insulating film 4 and the second interlayer insulating film 5 by virtue of the photolithography method. Thereafter, an amorphous silicon layer into which n-type impurity such as phosphorus, arsenic, etc. is doped is grown in the second hole 5a and the second interlayer insulating film 5.

Then, the amorphous silicon layer is removed from the upper surface of the second interlayer insulating film 5 by the chemical mechanical polishing (CMP) method. Hence, the amorphous silicon layer left in the second hole 5a is used as a plug 6.

Then, a silicon nitride film 7 of 50 nm thickness is formed on the second interlayer insulating film 5 and the plug 6. Then, a third interlayer insulating film 8 made of BPSG is formed to have a thickness of 1.2 $\mu$m. Then, a surface of the third interlayer insulating film 8 is planarized by heating the third interlayer insulating film 8 to reflow.

Figure 2B:
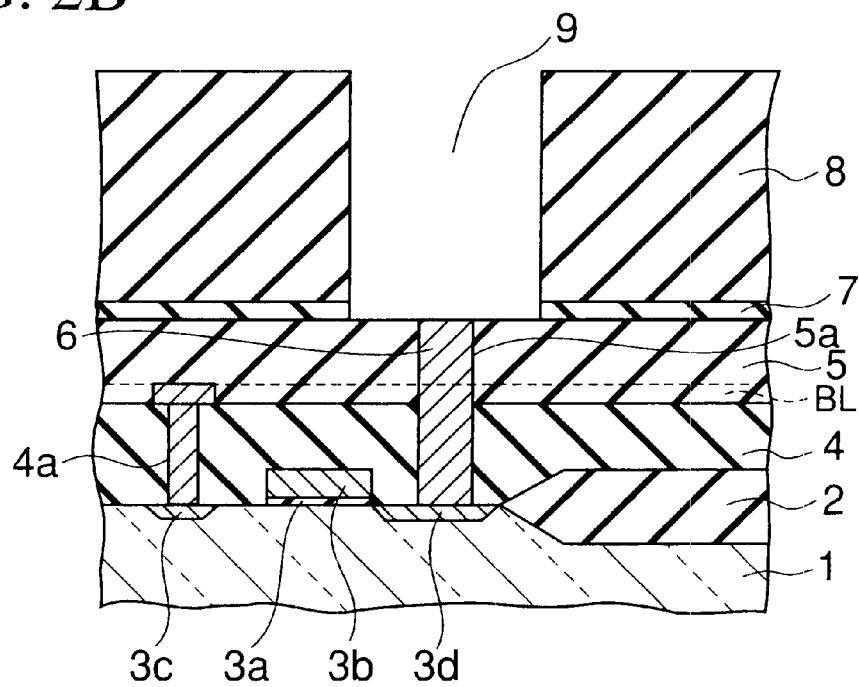

Then, as shown in FIG. 2B, an opening portion 9 having a storage electrode profile is formed on the plug 6 and its peripheral region by patterning the third interlayer insulating film 8 and the silicon nitride film 7 by virtue of the photolithography method.

Figure 2C:
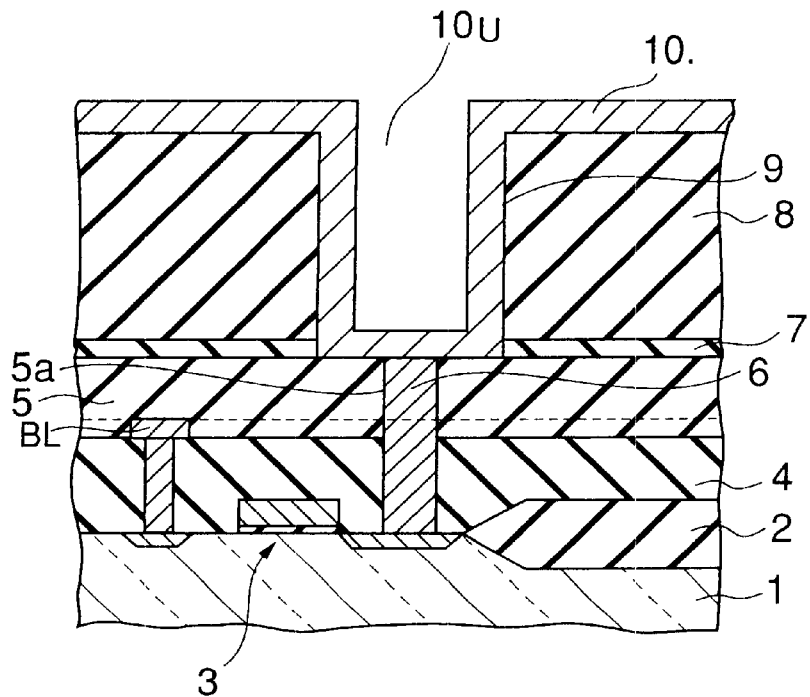

In addition, as shown in FIG. 2C, an amorphous silicon film 10 of 75 nm thickness is formed on the inner surface the opening portion 9 and on the upper surface of the third interlayer insulating film 8. The amorphous silicon film 10 is formed to contain phosphorus in an impurity concentration lower than $2 \times 10^{20}$ $cm^{-3}$, e.g., $1 \times 10^{20}$ $cm^{-3}$ or is formed in its undoped state. In this case, a concave portion 10u is present on the amorphous silicon film 10 in the opening portion 9.

Figure 2D:
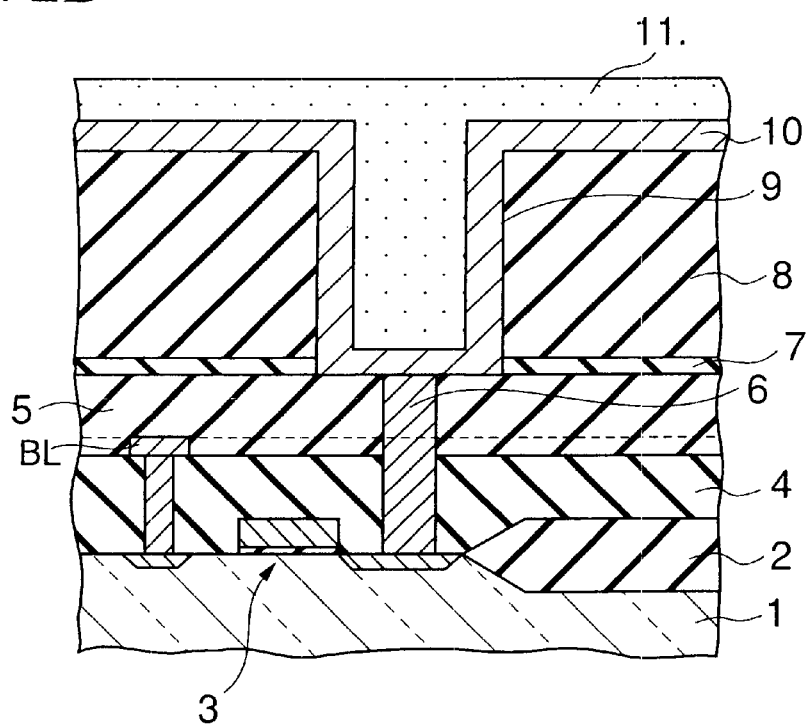

After this, as shown in FIG. 2D, photoresist (protection film) 11 is coated on the amorphous silicon film 10 and then the photoresist 11 is baked.

Figure 2E:
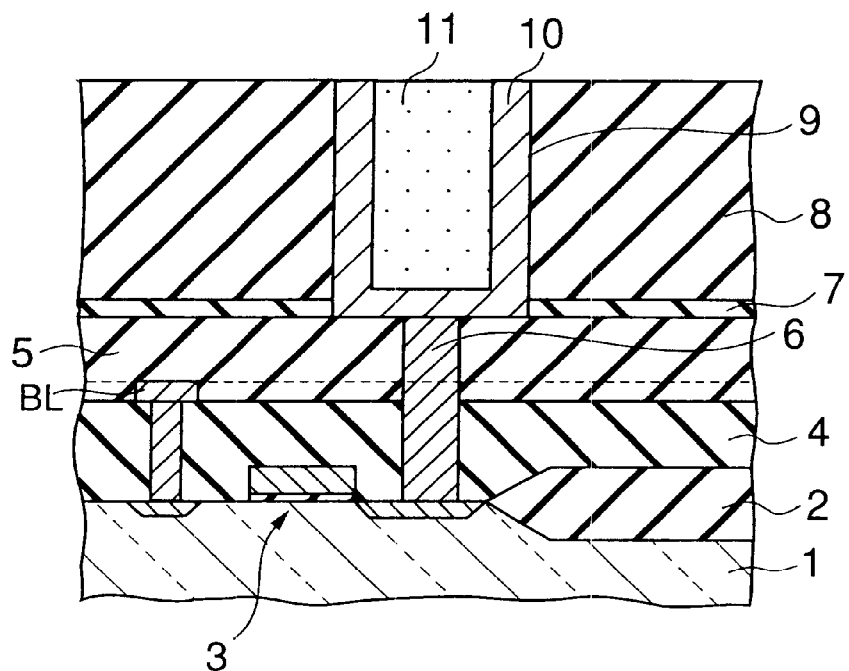

Then, as shown in FIG. 2E, the photoresist 11 and the amorphous silicon film 10 are removed from an upper surface of the third interlayer insulating film 8 by polishing them by virtue of the CMP method. After the polishing, the amorphous silicon film 10 remains in the opening portion 9 like a cylinder with a bottom. Then, an inside of the cylinder is filled with the photoresist 11. As a result, only an uppermost surface of the cylindrical amorphous silicon film 10 is exposed to the outside.

In this case, SOG (Spin-On-Glass) may be used as the protection film in lieu of the photoresist 11.

Figure 2F:
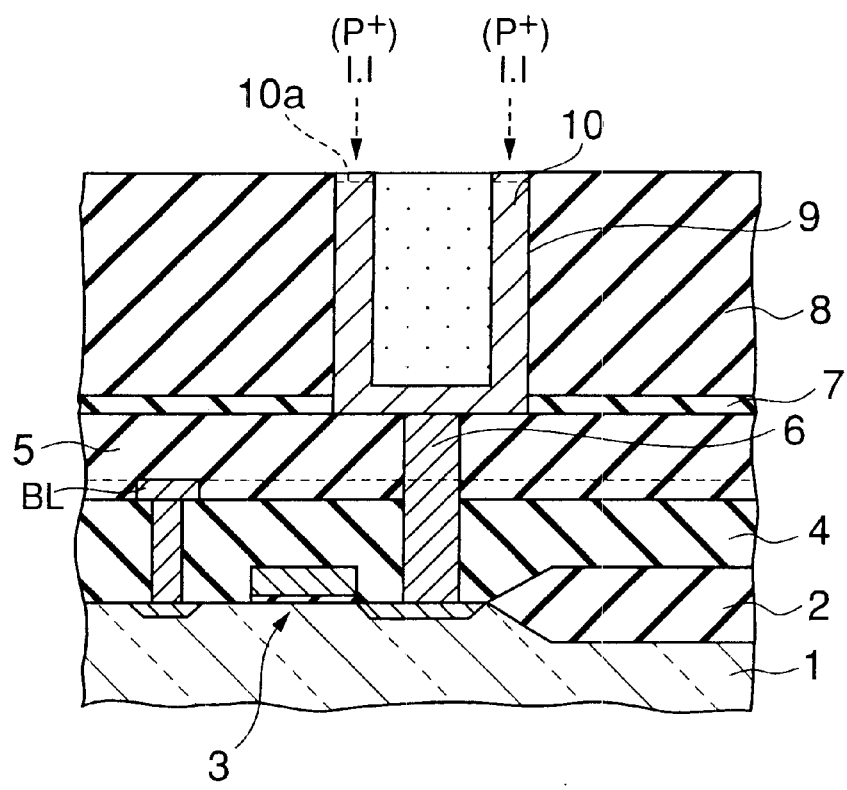

In turn, as shown in FIG. 2F, the phosphorus is ion-implanted in the substantially perpendicular direction to the upper surface of the third interlayer insulating film 8. Thus, the phosphorus can be implanted locally into the upper portion of the amorphous silicon film 10 while using the photoresist 11 and the third interlayer insulating film 8 as a mask.

If the acceleration energy of 5 keV and the dosage of $1 \times 10^{15}$ $cm^{-2}$ or more are set as the phosphorus-ion implantation conditions, the phosphorus can be implanted locally into the uppermost portion 10a of the cylindrical amorphous silicon film 10 such that the impurity concentration of the phosphorus at the uppermost portion is about $1 \times 10^{21}$ $cm^{-3}$ or more.

In this case, arsenic may be used as the impurity implanted into the amorphous silicon film 10 in lieu of the phosphorus.

Figure 2G:
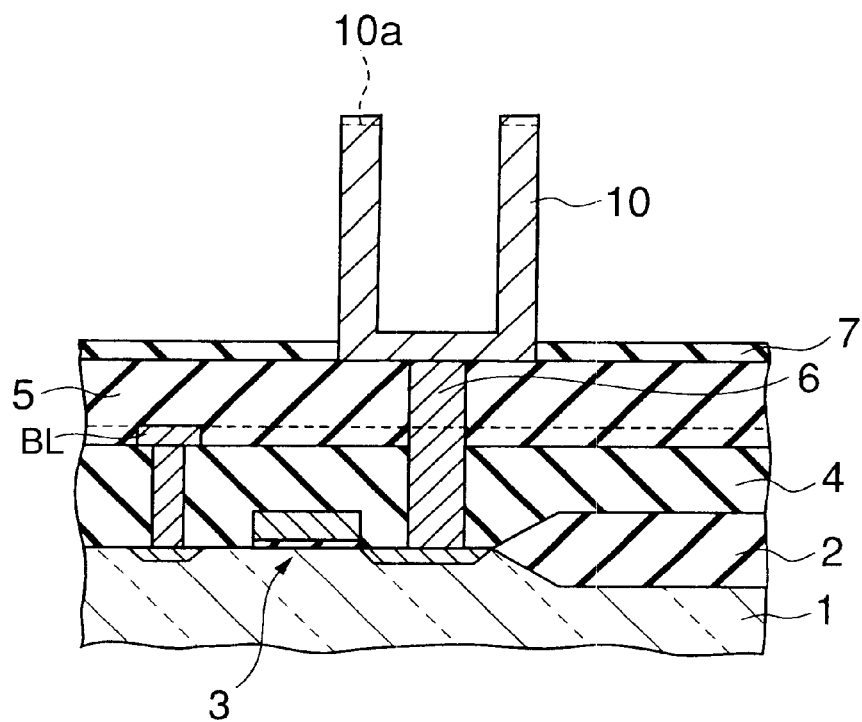

After this, as shown in FIG. 2G, the photoresist 11 is removed by the solvent or the oxygen plasma and then the third interlayer insulating film 8 is removed by the hydrofluoric acid. Thus, the cylindrical amorphous silicon film 10 is exposed on the silicon nitride film 7. Then, the amorphous silicon film 10 is cleaned by using the SC-1 and DHF solution. Where SC-1 is a mixed solution of ammonia and hydrogen peroxide, and DHF is a solution obtained by diluting the hydrofluoric acid with a pure water.

Figure 3:
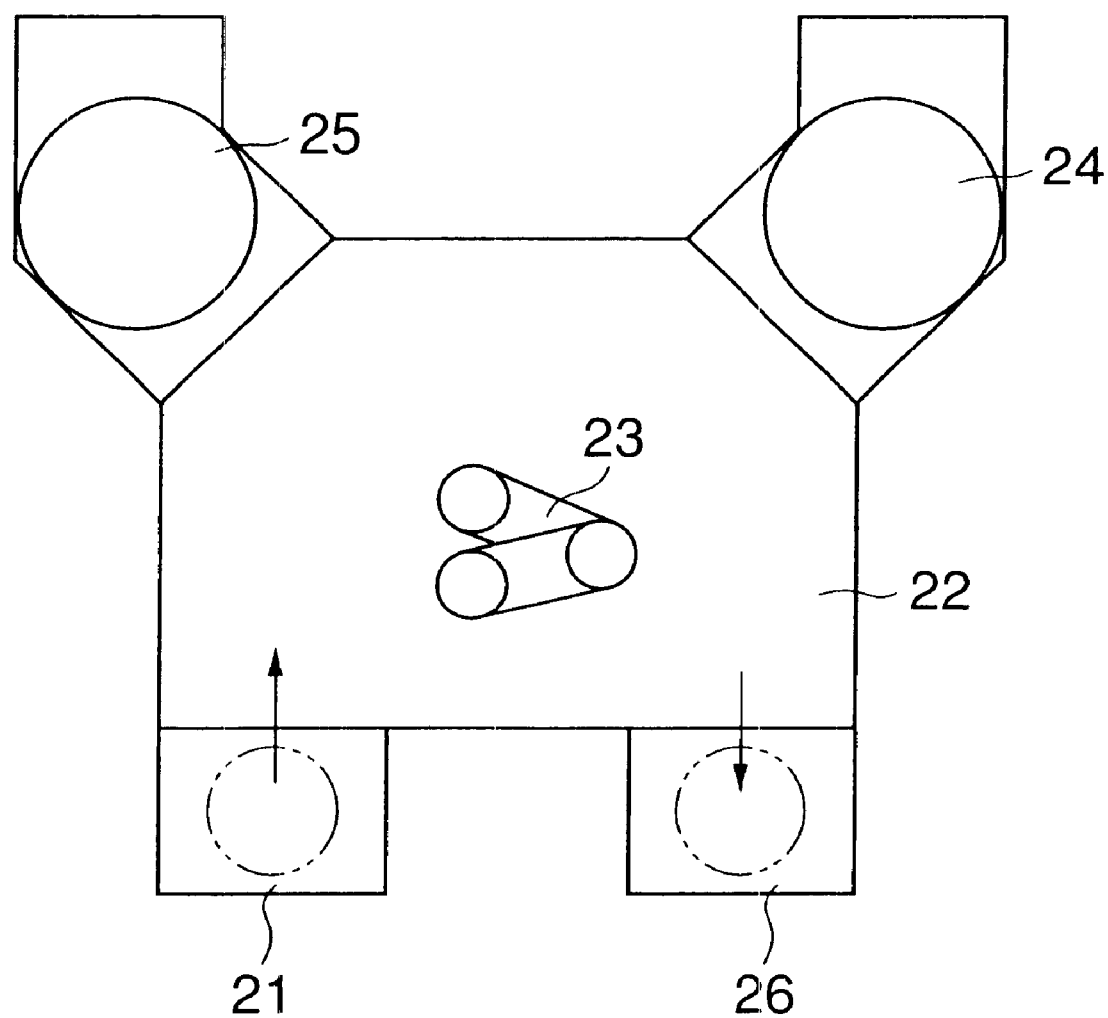
FIG. 3 is a plan view showing a configuration of process equipment used in embodiments of the present invention.

Then, the silicon substrate 1 is loaded into a wafer carrying chamber 22 via a load lock chamber 21 of a processing equipment shown in FIG. 3. Then, the silicon substrate 1 is loaded into a vertical furnace 24 by operating a robot 23 in the wafer carrying chamber 22. In this case, an inside of the wafer carrying chamber 22 is set to a low pressure atmosphere containing a nitrogen gas.

Then, a silane ($SiH_4$) gas is irradiated onto the amorphous silicon film 10 for 20 minutes in the situation that the silicon substrate 1 is heated at 560° C. in the vertical furnace 24. A pressure in the vertical furnace 24 in this case is about $5 \times 10^{-4}$ Torr. Disilane may be used as the silicon compound gas.

Figure 2H:
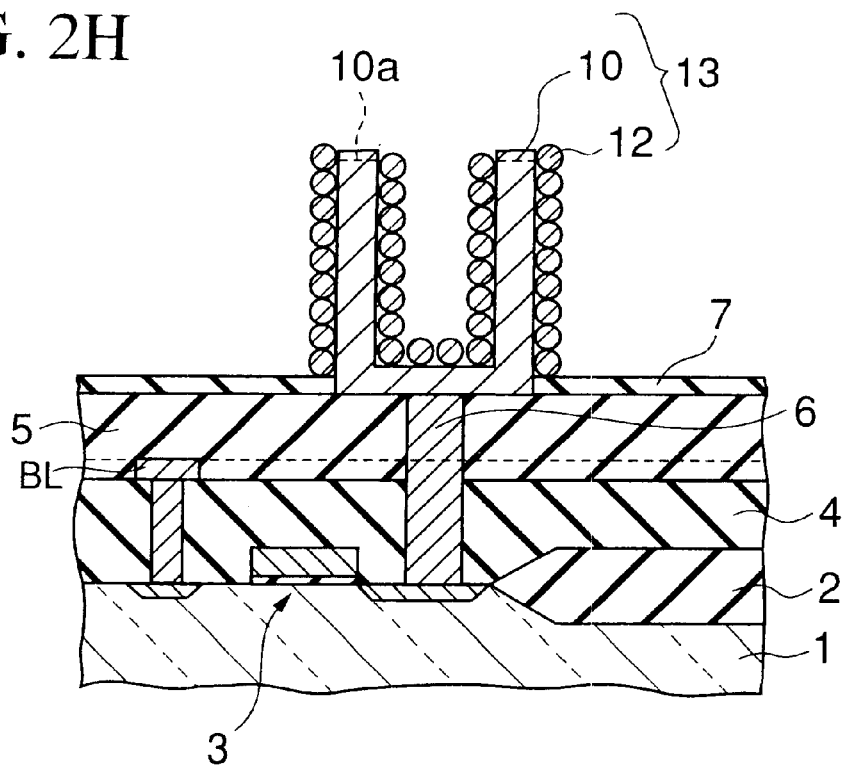

In turn, the pressure in the vertical furnace 24 is reduced to about $5 \times 10^{-8}$ Torr by exhausting the inside into vacuum, and then the amorphous silicon film 10 is annealed at 560° C. for 20 minutes. Thus, as shown in FIG. 2H, the HSG layer 12 is formed on an inner surface and an outer peripheral surface of the cylindrical amorphous silicon film 10 to make these surfaces uneven, but the HSG layer 12 is seldom grown on the ring-like uppermost surface of the cylinder. This is due to such property that the HSG layer 12 is difficult to be formed on the surface of the silicon film whose impurity concentration is $1 \times 10^{21}$ $cm^{-3}$ or more.

Figure 4A:
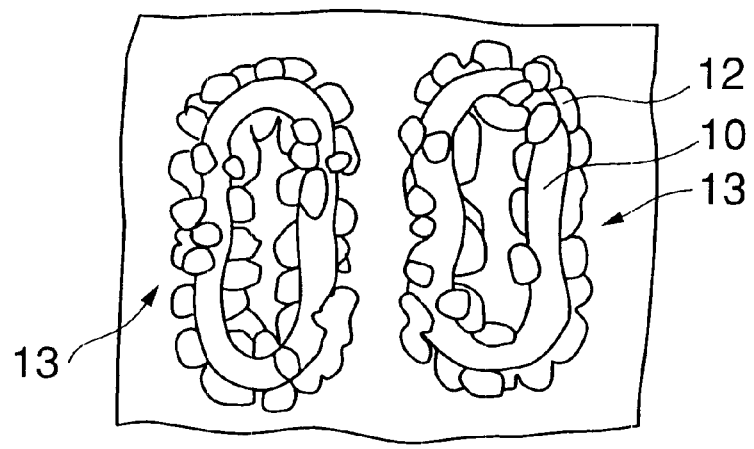
FIG. 4A is an upper view showing a storage electrode according to the first embodiment of the present invention.
Figure 4B:
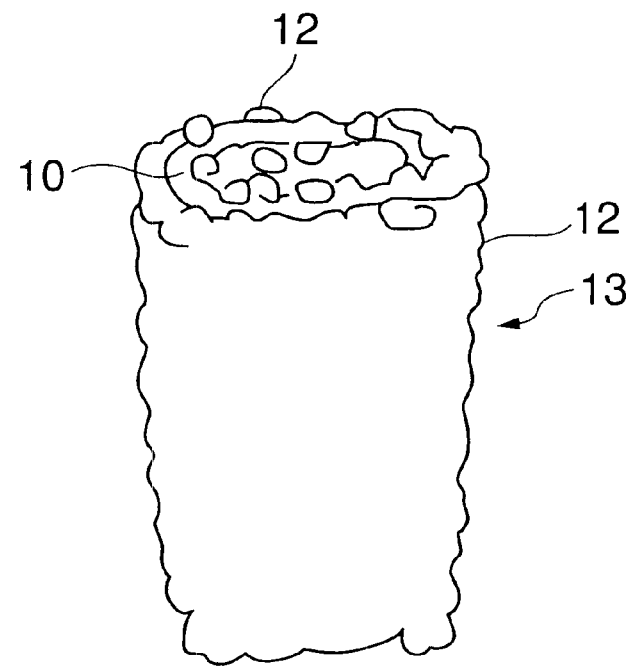
FIG. 4B is a perspective view showing the storage electrode shown in FIG. 4A.

A storage electrode 13 of a capacitor Q consists of the amorphous silicon film 10 and the HSG layer 12. An upper shape of the storage electrode 13 is shown in FIG. 4A, wherein the amorphous silicon film 10 is almost exposed from the ring-like uppermost surface of the storage electrode 13. In this case, an outer shape of the storage electrode 13 is roughly shown in FIG. 4B.

Figure 2I:
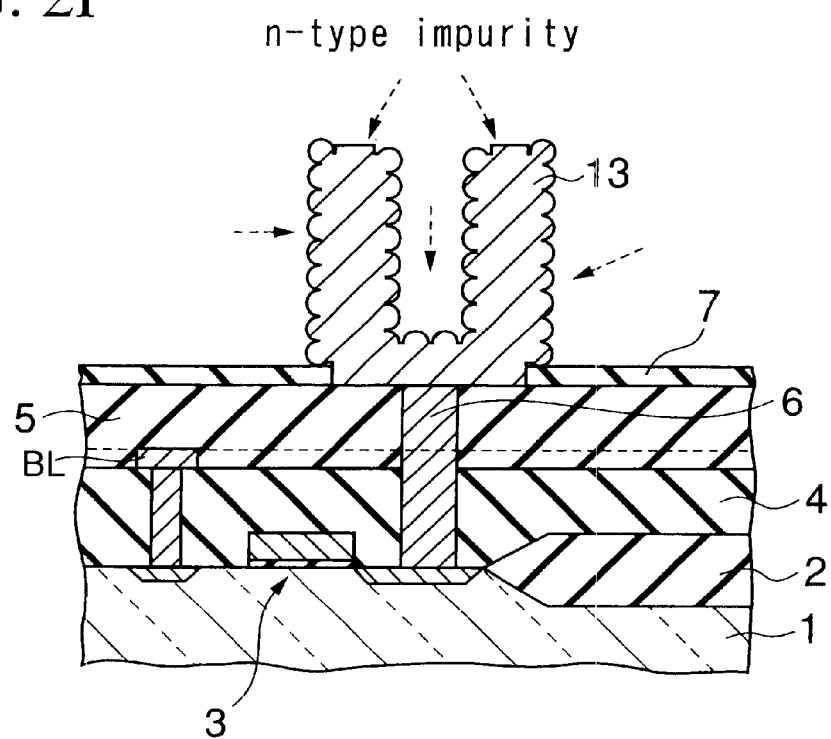

Then, the silicon substrate 1 is carried from the vertical furnace 24 to an impurity introducing furnace 25 by operating the robot 23 in the processing equipment shown in FIG. 3. In the impurity introducing furnace 25, as shown in FIG. 2I, the phosphorus is introduced by exposing the storage electrode 13 to the phosphine ($PH_3$) atmosphere while annealing the silicon substrate 1 at 650° C. for 120 minutes. Accordingly, a phosphorus impurity in the HSG layer 12 and on the surface of the amorphous silicon film 10, both constitute the storage electrode 13, is about $1 \times 10^{21}$ $cm^{-3}$ or more, whereas the phosphorus impurity in the inside of the amorphous silicon film 10 is lower than the above phosphorus impurity, e.g., about $6 \times 10^{20}$ $cm^{-3}$ to $7 \times 10^{20}$ $cm^{-3}$. Therefore, a conductivity of the storage electrode 13 is increased to perform a function as the electrode.

In this case, the impurity concentration in the uppermost portion 10a of the amorphous silicon film 10 constituting the storage electrode 13 becomes higher than that in other portions.

Then, the silicon substrate 1 is taken out to the outside via an unload lock chamber 26 by operating the robot 23, and then the storage electrode 13 is cleaned by the SC-1 and DHF solution. After this cleaning, no coming-off piece of the HSG layer 12 is found on the surface of the silicon nitride film 7.

Figure 2J:
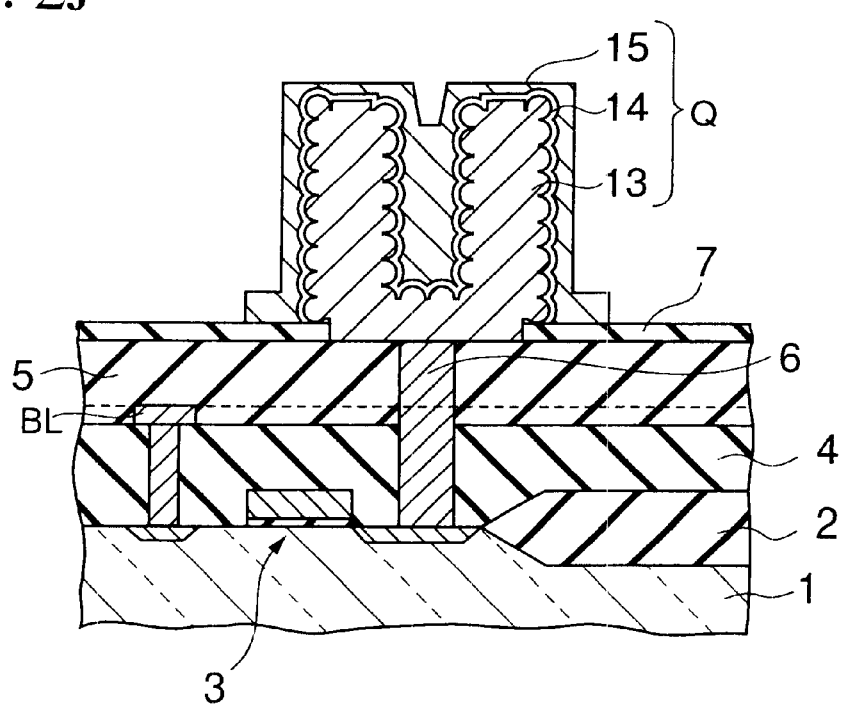

Then, as shown in FIG. 2J, a silicon nitride film (dielectric film) 14 is formed on the surface of the storage electrode 13 to have a thickness of 5 nm, and then a surface of the silicon nitride film 14 is oxidized at 700° C. by virtue of pyrogenic oxidation. Subsequently, a doped amorphous silicon film whose phosphorus concentration is $5 \times 10^{20}$ cm$^{-3}$ is formed as an opposing electrode 15. In this case, the amorphous silicon film 10 constituting the storage electrode 13 is poly-crystallized by the annealing after the HSG layer 12 is formed.

With the above, a capacitor of the DRAM cell can be completed.

It has been checked that the short-circuit between the storage electrodes can be extremely reduced in the completed capacitor rather than the prior art.

(Second Embodiment)

In a second embodiment, the steps of forming the capacitor by implanting the impurity ion in the situation that the photoresist is not filled in the cylinder of the amorphous silicon film constituting the storage electrode will be explained with reference to FIGS. 5A to 5F hereunder. Here, in FIGS. 5A to 5F, the same symbols as those in FIG. 2C denote the same elements.

Figure 5A:
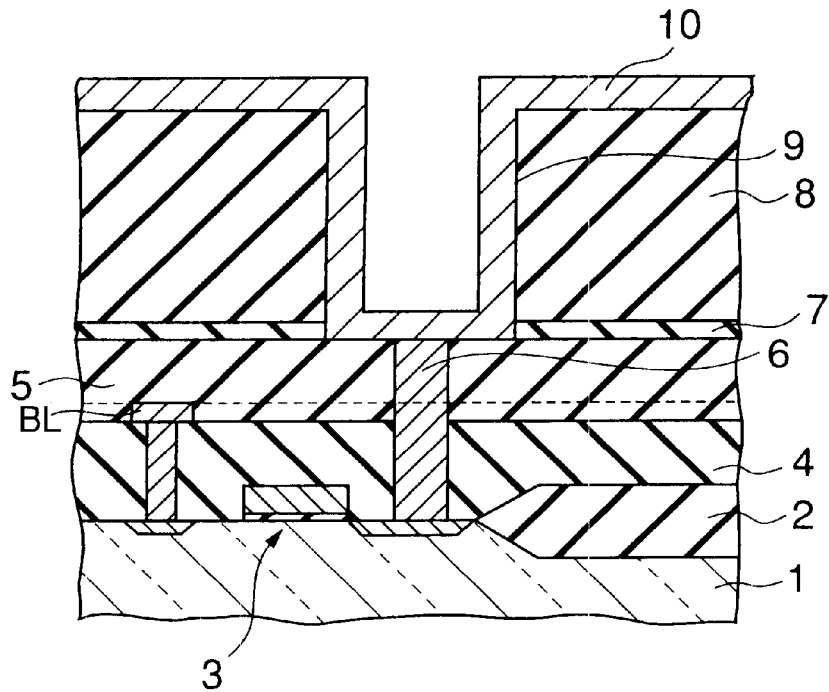
FIGS. 5A to 5F are sectional views showing the steps of forming a memory cell according to a second embodiment of the present invention.

In the second embodiment, as shown in FIG. 5A, the amorphous silicon film 10 is formed along the upper surface of the third interlayer insulating film 8 and the inner surface of the opening 9 via the similar steps to those in the first embodiment. The impurity in the amorphous silicon film 10 is set to a concentration smaller than $1 \times 10^{21}$ cm$^{-3}$ or is undoped.

Figure 5B:
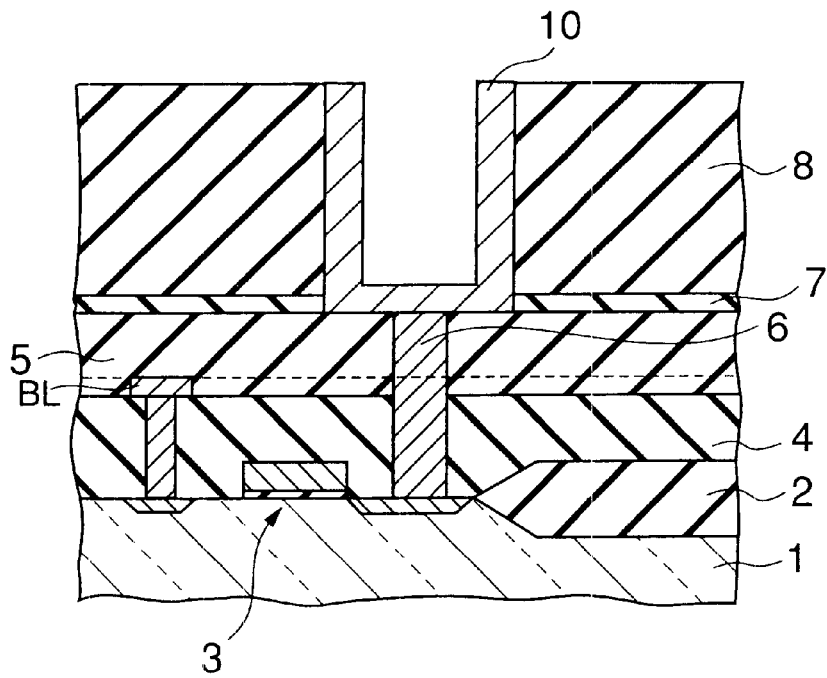

After this, as shown in FIG. 5B, the amorphous silicon film 10 is shaped into the cylinder with a bottom by removing the amorphous silicon film 10 from the upper surface of the third interlayer insulating film 8 by virtue of the CMP method.

Figure 5C:
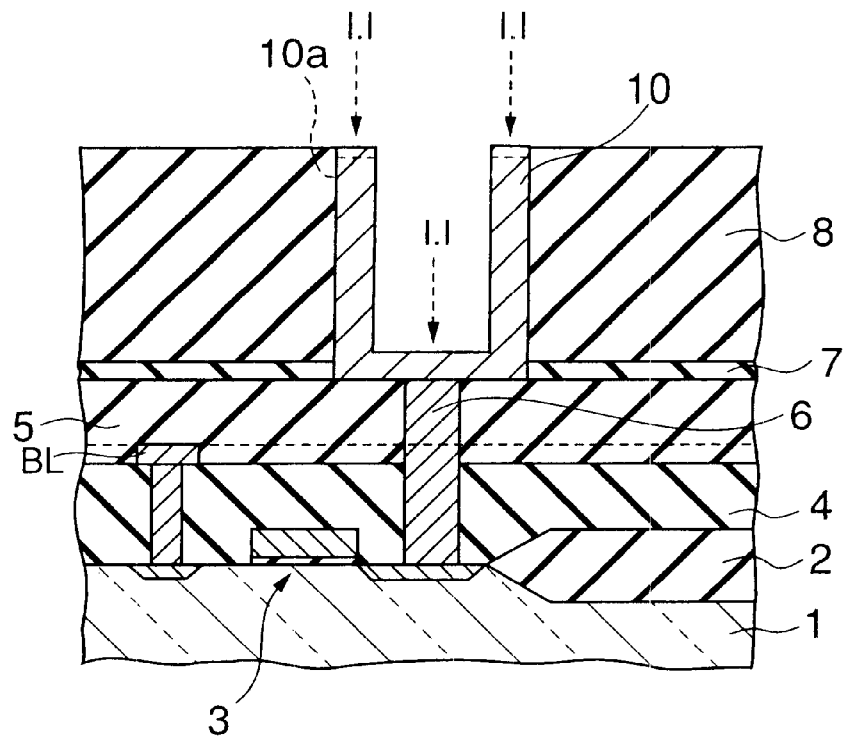

Then, as shown in FIG. 5C, the impurity such as phosphorus, arsenic, etc. is ion-implanted in the perpendicular direction to the upper surface of the third interlayer insulating film 8. If the acceleration energy of 5 keV and the dosage of $1 \times 10^{15}$ cm$^{-2}$ or more are set as the ion implantation conditions, the phosphorus can be implanted locally into the uppermost portion 10a and a bottom surface of the cylindrical amorphous silicon film 10 such that the impurity concentration of the phosphorus at the uppermost portion and the bottom surface is about $1 \times 10^{21}$ cm$^{-3}$ or more.

Figure 5D:
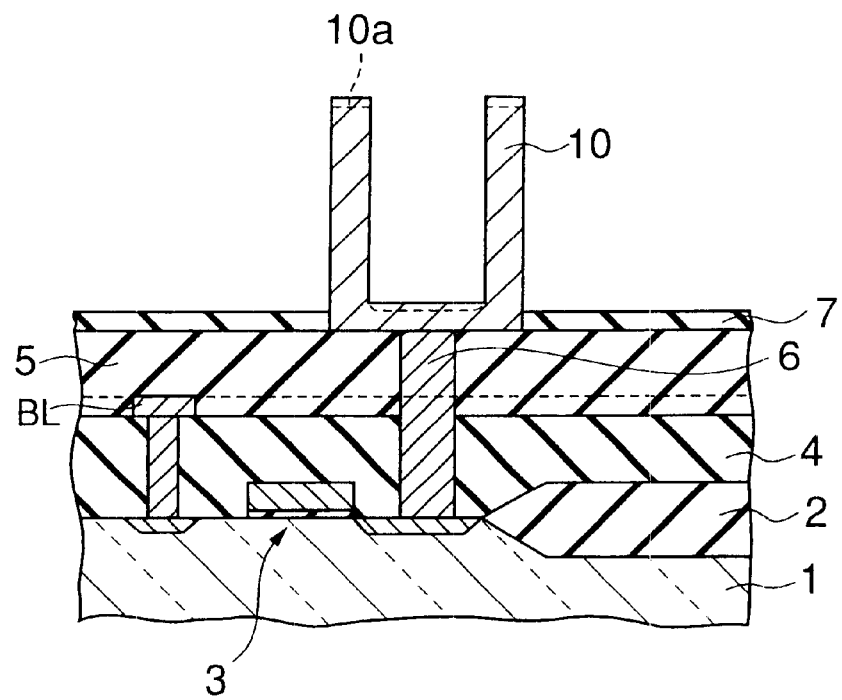

Then, as shown in FIG. 5D, the amorphous silicon film 10 is exposed like a cylindrical shape on the silicon nitride film 7 by removing the third interlayer insulating film 8 by using the hydrofluoric acid. In turn, the amorphous silicon film 10 is cleaned by using the SC-1 and DHF solution.

After this, the silicon substrate 1 is put into the vertical furnace 24 shown in FIG. 3. Then, a gaseous silane (SiH$_4$) (silicon compound) is irradiated onto the amorphous silicon film 10 for 20 minutes while annealing the silicon substrate 1 at 560° C. in the vertical furnace 24. A pressure in the vertical furnace 24 in this case is about $5 \times 10^{-4}$ Torr.

The impurity may be ion-implanted into the uppermost portion 10a of the amorphous silicon film 10 after the third interlayer insulating film 8 is removed.

Figure 5E:
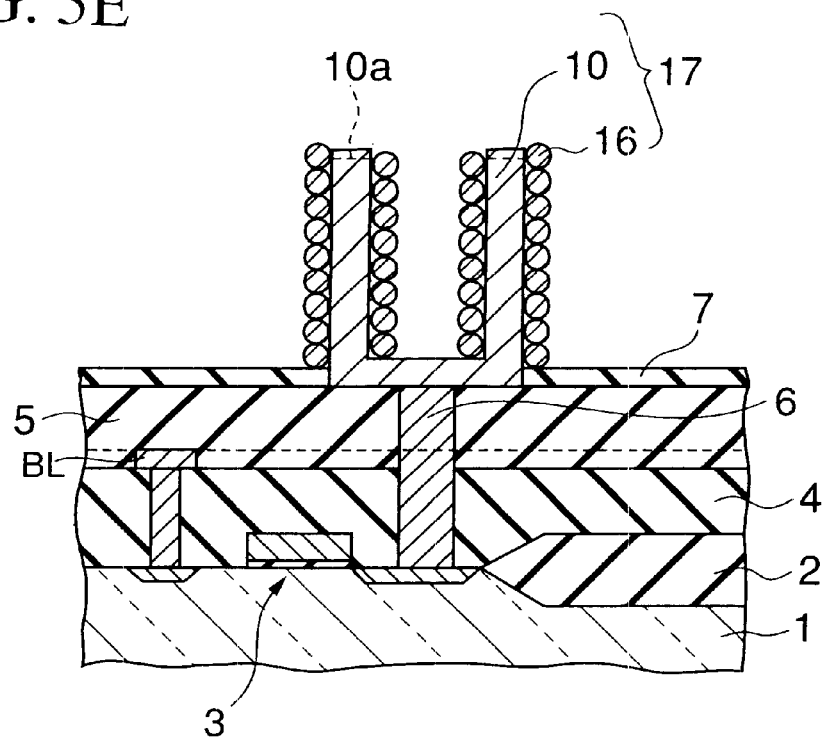

Then, the pressure in the vertical furnace 24 is reduced to about $5 \times 10^{-8}$ Torr by exhausting the inside into vacuum, and then the amorphous silicon film 10 is annealed at 560° C. for 20 minutes. Thus, as shown in FIG. 5E, the HSG layer 16 is formed on the inner surface and the outer peripheral surface of the cylindrical amorphous silicon film 10 to make these surfaces uneven. But the HSG layer 16 is seldom grown on the ring-like uppermost surface and the bottom surface of the cylinder.

The storage electrode 17 of the capacitor Q consists of the amorphous silicon film 10 and the HSG layer 16.

Then, the phosphorus can be introduced into the storage electrode 17 by exposing the storage electrode 17 to the phosphine (PH$_3$) atmosphere while annealing the silicon substrate 1 at 650° C. for 120 minutes in the impurity introducing furnace 25 shown in FIG. 3. In this case, the phosphorus impurity in the HSG layer 16 and on the surface layer of the amorphous silicon film 10 is about $1 \times 10^{21}$ cm$^{-3}$ or more, whereas the phosphorus impurity in the inside of the amorphous silicon film 10 is lower than the above phosphorus impurity. Therefore, a conductivity of the storage electrode 17 is increased.

In this case, the impurity concentration in the uppermost portion 10a and the bottom surface of the amorphous silicon film 10 constituting the storage electrode 17 becomes higher than that in other portions.

Then, the silicon substrate 1 is taken out to the outside, and then the storage electrode 17 is cleaned by the SC-1 and DHF solution. After this cleaning, no coming- off piece of the HSG layer 16 is found on the surface of the silicon nitride film 7.

Figure 5F:
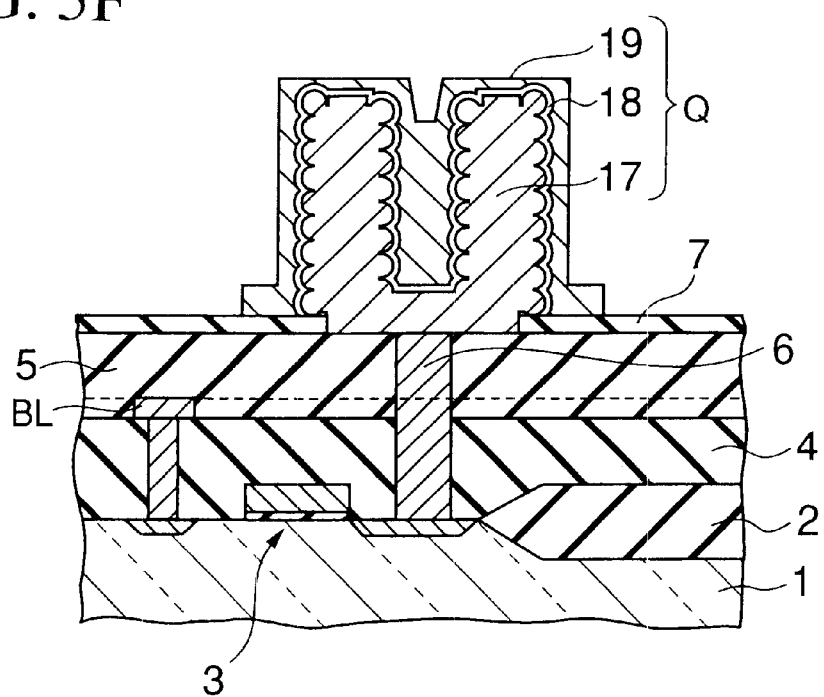

Then, as shown in FIG. 5F, a silicon nitride film (dielectric film) 18 is formed on the surface of the storage electrode 17 by the CVD method to have a thickness of 5 nm. Then, a surface of the silicon nitride film 18 is oxidized at 700° C. by virtue of pyrogenic oxidation. Subsequently, a doped amorphous silicon film whose phosphorus concentration is $5 \times 10^{20}$ cm$^{-3}$ is formed as an opposing electrode 19.

With the above, a capacitor of the DRAM cell can be completed.

It has been checked that the short-circuit between the storage electrodes can be extremely reduced in the completed capacitor rather than the prior art.

Figure 6:
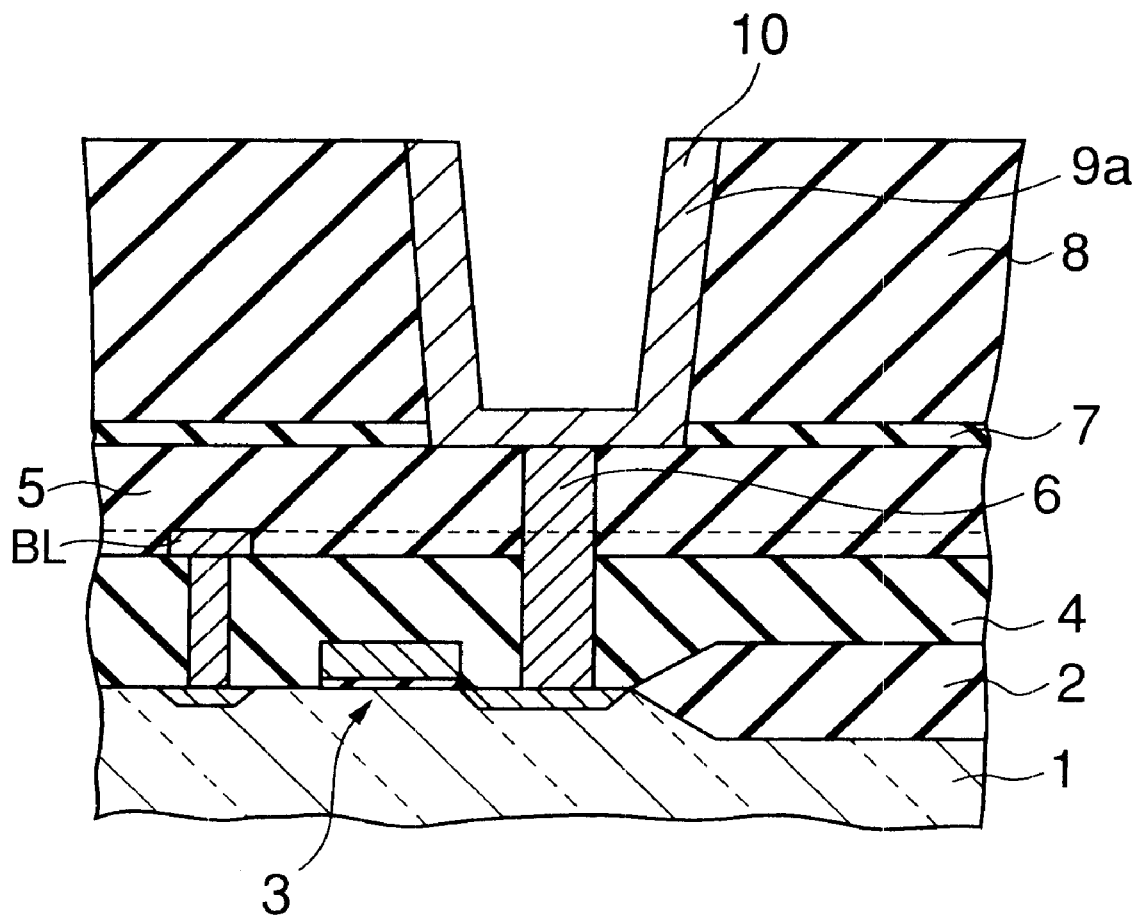
FIG. 6 is a sectional view showing a variation of the steps of forming the memory cell according to the second embodiment of the present invention.

By the way, as shown in FIG. 6, if a diameter of an upper portion of an opening 9a formed in the third interlayer insulating film 8 is larger than that of a lower portion like a taper shape, the cylindrical amorphous silicon film 10 has also a taper shape. In this case, since the concentration of the impurity being ion-implanted in the perpendicular direction to the upper surface of the third interlayer insulating film 8 does not become so high on the inner peripheral surface of the cylinder, there exist no effect for stopping the growth of the HSG layer 16 on the inner peripheral surface. Therefore, the HSG layer 16 formed on the surface of the amorphous silicon film 10 is similar to that in FIG. 5E.

The amorphous silicon film is formed into the circular cylindrical shape in above two embodiments. But the amorphous silicon film may be formed into a column shape.

As described above, before the hemispherical grained silicon is formed on the surface of the undoped or low impurity concentration cylindrical or column amorphous silicon film, the impurity is implanted into the uppermost surface of the amorphous silicon film with high concentration, e.g., higher than $2 \times 10^{20}$ cm$^{-3}$. Therefore, since the hemispherical grained silicon is extremely difficult to grow on the uppermost surface of the cylindrical amorphous silicon film, a probability of coming-off of the hemispherical grained silicon from the corner portion of the uppermost surface of the cylindrical amorphous silicon film can be extremely reduced and thus the short-circuit between the cylindrical or column amorphous silicon films by the come-off hemispherical grained silicon can be prevented.

Accordingly, production yield of the DRAM that uses the silicon film having such hemispherical grained silicon as the storage electrode can be improved.

What is claimed is:

1. A method of manufacturing a semiconductor device, comprising the steps of:

forming an undoped or low impurity concentration amorphous silicon film to project from an upper surface of a first insulating film;

introducing selectively impurity into an uppermost surface of the amorphous silicon film to form the uppermost surface of the amorphous silicon film as a high concentration impurity region;

forming hemispherical grained silicon on the uppermost surface of the amorphous silicon film at a first density and on a side surface at a second density higher than the first density by exposing the amorphous silicon film to a silicon compound gas and then annealing the amorphous silicon film in a low pressure atmosphere; and introducing the impurity into the hemispherical grained silicon and the amorphous silicon film.

2. A method of manufacturing a semiconductor device according to claim 1, wherein the amorphous silicon film is formed like a cylindrical shape on the first insulating film.

3. A method of manufacturing a semiconductor device according to claim 1, wherein the low impurity concentration is less than $2 \times 10^{20}$ cm$^{-3}$.

4. A method of manufacturing a semiconductor device according to claim 1 or claim 3, wherein the high concentration impurity region has an impurity concentration higher than $2 \times 10^{20}$ cm$^{-3}$.

5. A method of manufacturing a semiconductor device according to claim 1, wherein the impurity is phosphorus or arsenic.

6. A method of manufacturing a semiconductor device according to claim 2, wherein, when the impurity is implanted into the uppermost surface of the amorphous silicon film that is formed like the cylindrical shape, an outer peripheral surface of the amorphous silicon film is covered with a second insulating film and also an inner peripheral surface of the amorphous silicon film is covered with a protection film.

7. A method of manufacturing a semiconductor device according to claim 6, wherein the second insulating film is formed of an oxide film and is selectively removed after the impurity is implanted into the amorphous silicon film.

8. A method of manufacturing a semiconductor device according to claim 6, wherein the protection film is photo-resist film.

9. A method of manufacturing a semiconductor device according to claim 1, wherein the silicon compound gas is a silane gas.

10. A semiconductor device comprising:

a storage electrode having a silicon film formed over a semiconductor substrate and a hemispherical grained silicon film formed on a surface of the silicon film such that a density of an uppermost surface of the hemispherical grained silicon film is lower than that of a side surface of the silicon film;

a dielectric film for covering the hemispherical grained silicon film and the silicon film; and an opposing electrode formed on the dielectric film.

11. A semiconductor device according to claim 10, wherein an impurity concentration contained in an uppermost portion of the silicon film is higher than that in other regions.

12. A semiconductor device according to claim 10, wherein the silicon film has a cylindrical shape.

13. A semiconductor device according to claim 12, wherein the side surface of the silicon film includes an inner-face and an outer peripheral-face of the cylindrical shape.

* * * * *